United States Patent
Yano et al.

(10) Patent No.: US 6,922,024 B2
(45) Date of Patent: Jul. 26, 2005

(54) LED LAMP

(75) Inventors: Tadashi Yano, Kyoto (JP); Masanori Shimizu, Kyotanabe (JP); Nobuyuki Matsui, Takatsuki (JP); Tatsumi Setomoto, Takatsuki (JP); Tetsushi Tamura, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/720,791

(22) Filed: Nov. 24, 2003

(65) Prior Publication Data

US 2004/0124430 A1 Jul. 1, 2004

(30) Foreign Application Priority Data

Nov. 25, 2002 (JP) .......................... 2002-340366

(51) Int. Cl.[7] .......................... H05B 37/02; H01L 29/22
(52) U.S. Cl. .......................... 315/291; 257/79; 257/98
(58) Field of Search .......................... 315/169.4, 291; 257/79, 81, 98, 99, 100, 294; 313/501–503, 512; H05B 37/02; H01L 29/22

(56) References Cited

U.S. PATENT DOCUMENTS 6,340,824 B1 * 1/2002 Komoto et al. ............... 257/99
6,417,019 B1 * 7/2002 Mueller et al. ............... 438/29
6,806,658 B2 * 10/2004 Tan et al. .................... 315/291
2003/0189829 A1  10/2003 Shimizu et al.
2004/0119086 A1 * 6/2004 Yano et al. .................... 257/98

FOREIGN PATENT DOCUMENTS

| JP | 05-290818 | 11/1993 |
| JP | 10-065221 | 3/1998 |
| JP | 2001-358370 | 12/2001 |

* cited by examiner

Primary Examiner—Trinh Vo Dinh
(74) Attorney, Agent, or Firm—Akin Gump Strauss Hauer & Feld, LLP

(57) ABSTRACT

An LED lamp includes at least one LED chip having an emission peak wavelength of 400 nm to 490 nm, and a wavelength converting portion including a phosphor for transforming the emission of the LED chip into light having a longer wavelength than that of the emission. The LED lamp further includes a filtering member, of which the spectral transmittance is adjusted so as to minimize color shifting even if the amount of current supplied to the LED chip to make the LED chip produce the emission has changed.

14 Claims, 9 Drawing Sheets

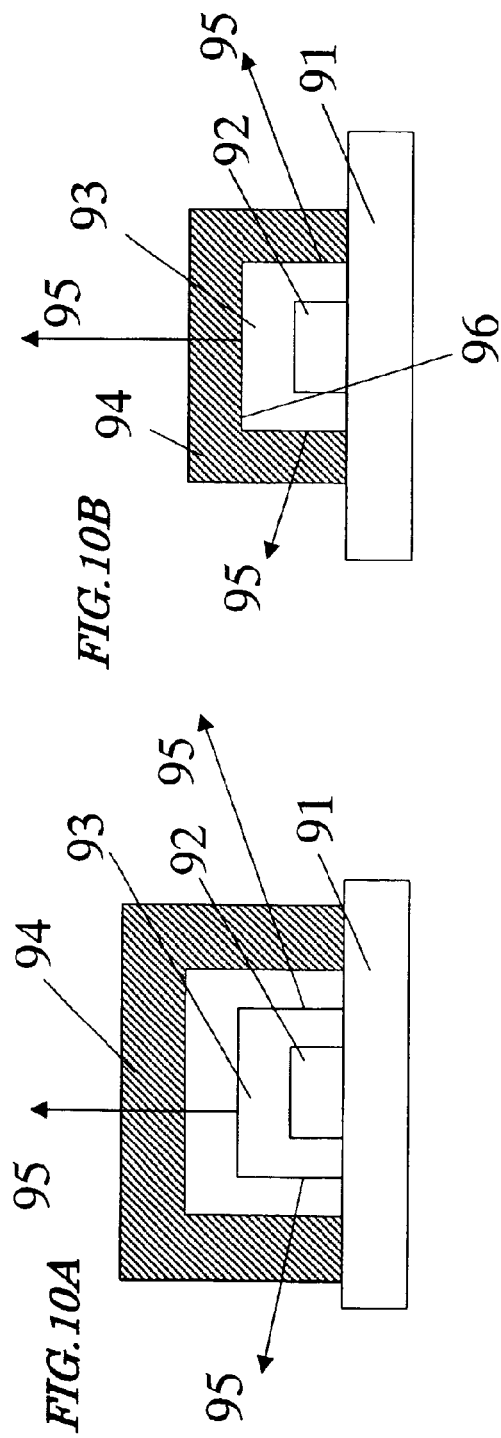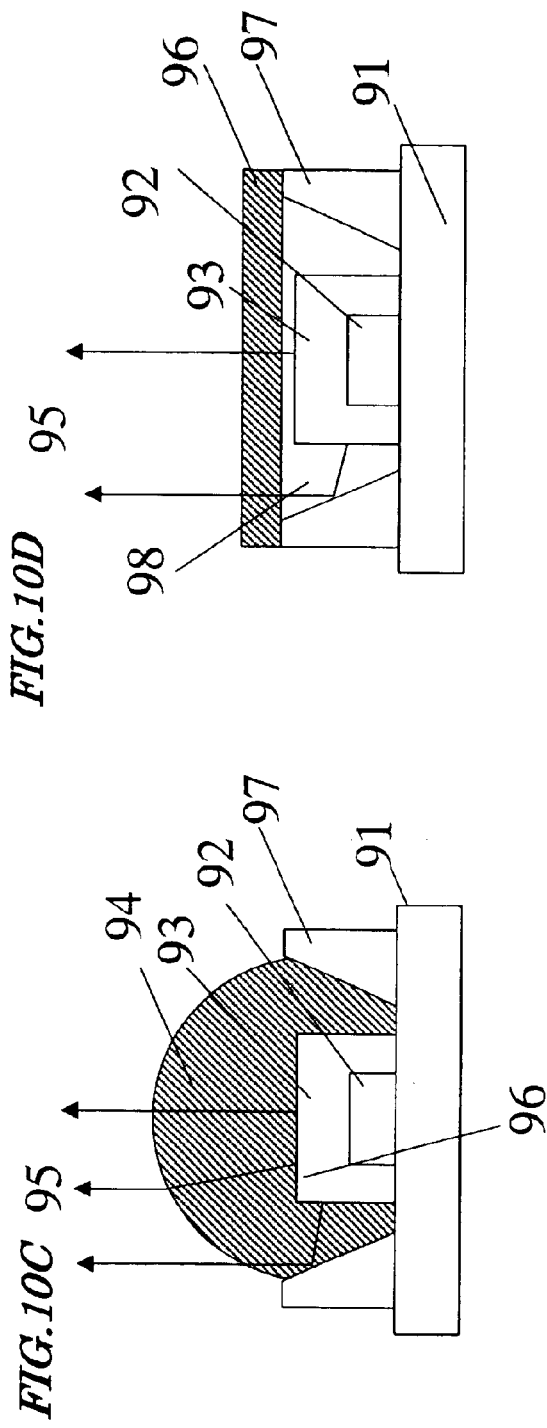

LED LAMP

BACKGROUND OF THE INVENTION

1. Field of the Invention

The present invention relates to an LED lamp including a wavelength converting portion with a phosphor.

2. Description of the Related Art

White LED lamps are recently under vigorous research and development as potential replacements for white incandescent lamps. In some of those white LED lamps, the package of a blue LED chip, made of gallium nitride (GaN), is coated with a phosphor such as YAG. In such an LED lamp, the blue LED chip produces an emission with a wavelength of about 450 nm, and the phosphor produces yellow fluorescence with a peak wavelength of about 550 nm on receiving that emission. Eventually, the emission and fluorescence mix with each other, thereby providing white light.

In another type of white LED lamp currently under development, an LED chip that emits an ultraviolet ray is combined with a phosphor that produces red (R), green (G) and blue (B) light rays. In such an LED lamp, the ultraviolet ray that has been radiated from the LED chip excites the phosphor, thereby emitting the red, green and blue light rays. Consequently, white light can also be obtained as a mixture of these light rays.

A bullet-shaped package is extensively used in conventional LED lamps. Hereinafter, such an LED lamp with a bullet-shaped appearance will be described with reference to FIG. 1.

FIG. 1 illustrates a cross-sectional structure for a conventional LED lamp 20 as disclosed in Japanese Patent No. 2998696, for example. As shown in FIG. 1, the LED lamp 20 includes an LED chip 21, a bullet-shaped transparent housing to cover the LED chip 21, and leads 22a and 22b to supply current to the LED chip 21. A cup reflector 23 for reflecting the emission of the LED chip 21 in the direction indicated by the arrow D is provided for the mount portion of the lead 22b. The inner walls (i.e., reflective surfaces) of the cup reflector 23 surround the side surfaces of the LED chip 21 so as to define a predetermined tilt angle with respect to the bottom of the cup reflector 23. The LED chip 21 on the mount portion is encapsulated with a first resin portion 24, which is further encapsulated with a second resin portion 25.

The first resin portion 24 is obtained by filling the cup reflector 23 with a resin material and curing it after the LED chip 21 has been mounted onto the bottom of the cup reflector 23 and then has had its cathode and anode electrodes electrically connected to the leads 22a and 22b by way of wires. A phosphor 26 is dispersed in the first resin portion 24 so as to be excited with the light A that has been emitted from the LED chip 21. The excited phosphor 26 produces fluorescence (which will be referred to herein as "light B") that has a longer wavelength than the light A. This LED lamp 20 is designed such that if the light A radiated from the LED chip 21 is red, then the light B emitted from the phosphor 26 is yellow. A portion of the light A is transmitted through the first resin portion 24 including the phosphor 26. As a result, light C as a mixture of the light A and light B is used as illumination light. The light A may exhibit a narrow-band spectral distribution with a peak wavelength of about 470 nm, while the light B may exhibit a broad-band spectral distribution with a peak wavelength of about 570 nm, for example. FIG. 2 shows an exemplary spectral distribution of illumination light obtained from such an LED lamp.

In the conventional LED lamp shown in FIG. 1, however, if the amount of the current supplied to the LED chip (i.e., drive current) changes, a variation (such as color shifting) easily occurs in the spectral distribution of the illumination light. Such color shifting happens because the emission state of the LED chip, and eventually the spectral distribution of the light A radiated from the LED chip, are changeable with the amount of the drive current supplied thereto. Normally, the smaller the amount of drive current supplied, the longer the emission peak wavelength of an LED chip tends to be. If the spectral distribution of the light A radiated from the LED chip changes in this manner, then the spectral distribution of the light B, produced from the phosphor 26 in the resin that covers the LED chip, also changes. As a result, the spectral distribution profile shown in FIG. 2 changes. On the other hand, the luminance of an illumination source needs to be adjusted according to the situation. Accordingly, when an LED lamp is used as an illumination source, the drive current of its LED chip must be changed to achieve a desired luminance. Consequently, color shifting, resulting from such a change in the amount of drive current supplied, needs to be eliminated in order to use an LED lamp as an illumination source.

SUMMARY OF THE INVENTION

In order to overcome the problems described above, preferred embodiments of the present invention provide an LED lamp that does not cause the color shifting easily even if the amount of drive current supplied is changed.

An LED lamp according to a preferred embodiment of the present invention preferably includes at least one LED chip and a wavelength converting portion, i.e., wavelength shifter. The LED chip preferably has an emission peak wavelength of 400 nm to 490 nm. The wavelength converting portion preferably includes a phosphor for transforming the emission of the LED chip into light having a longer wavelength than that of the emission. The LED lamp preferably further includes filtering means. The spectral transmittance of the filtering means is preferably adjusted so as to minimize color shifting even if the amount of current supplied to the LED chip to make the LED chip produce the emission has changed.

In one preferred embodiment of the present invention, the spectral transmittance of the filtering means preferably corresponds to a wavelength dependence of an inverse change rate.

In this particular preferred embodiment, the spectral transmittance of the filtering means is preferably relatively low in a wavelength subrange in which the inverse change rate is less than 100%.

In another preferred embodiment, the filtering means is preferably designed such that the spectral transmittance thereof becomes lower in at least a portion of the wavelength range of 400 nm to 545 nm than in the remaining visible radiation range.

More specifically, the filtering means is preferably designed such that the spectral transmittance thereof becomes lower in at least a portion of a wavelength range, which is shorter than the emission peak wavelength of the LED chip, than in the remaining visible radiation range.

In still another preferred embodiment, in the wavelength range of 400 nm to 545 nm, the filtering means preferably has a filtering ratio of 3% to 35%.

In yet another preferred embodiment, the LED chip is preferably mounted on a substrate.

In a specific preferred embodiment, the LED chip is preferably flip-chip bonded to the substrate.

In yet another preferred embodiment, the wavelength converting portion is preferably made of a resin.

More particularly, the wavelength converting portion preferably has a cylindrical shape and covers the LED chip entirely.

In yet another preferred embodiment, the wavelength converting portion is preferably further covered with another resin.

In yet another preferred embodiment, the filtering means is preferably arranged so as to cover the wavelength converting portion.

In yet another preferred embodiment, the filtering means is preferably made of a resin.

In yet another preferred embodiment, the wavelength converting portion and the filtering means are preferably both made of the same resin and substantially no interface is preferably present between the wavelength converting portion and the filtering means.

In yet another preferred embodiment, the LED lamp preferably has a card shape so as to be attachable to, or removable from, an illumination unit including a lighting circuit.

According to various preferred embodiments of the present invention, a filtering member, which exhibits a selectively decreased spectral transmittance in a particular wavelength subrange, is applied to an LED lamp, thereby minimizing the color shifting of the LED lamp, which could otherwise be caused due to a variation in the amount of drive current supplied.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

FIGS. 10A, 10B, 10C and 10D are cross-sectional views respectively illustrating LED lamps according to first, second, third and fourth specific preferred embodiments of the present invention.

DETAILED DESCRIPTION OF PREFERRED EMBODIMENTS

Figure 3:
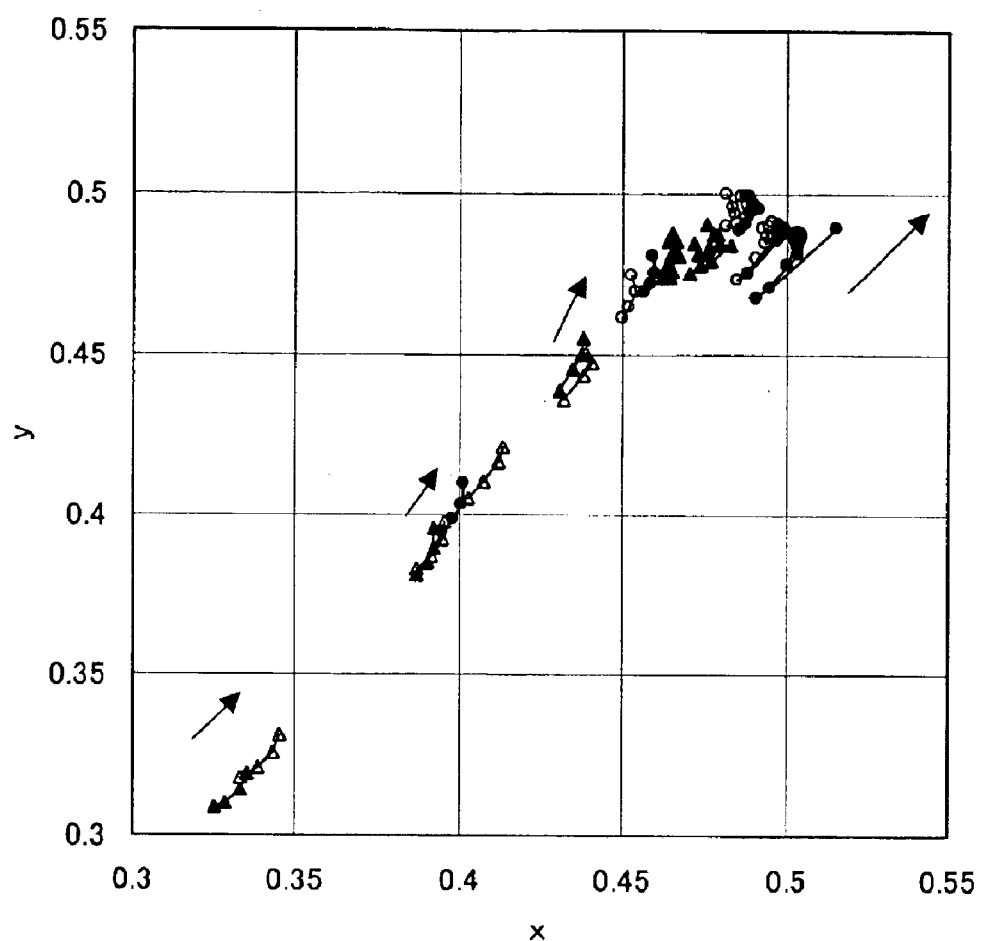
FIG. 3 is a chromaticity diagram showing how color shifting occurs in an LED lamp.

Hereinafter, it will be described in detail with reference to FIG. 3 how color shifting occurs in an LED lamp that includes a so-called "blue LED" chip and a wavelength converting portion (e.g., a resin including a phosphor) covering the LED chip. FIG. 3 is a graph (i.e., a chromaticity diagram plotting CIE 1931 x & y coordinates) showing chromaticities that were calculated for various types of LED lamps with such a configuration.

The chromaticities shown in FIG. 3 were calculated from the spectral distributions of the various types of LED lamps with mutually different phosphors, resin concentrations and/or volumes. The spectral distributions were measured with a spectral irradiance meter with drive currents of 5 mA, 10 mA, 20 mA and 40 mA supplied. The data points shown in FIG. 3 represent the chromaticity points of the respective LED lamps.

In FIG. 3, the chromaticity points of an LED lamp with the same configuration are represented by the same kind of signs (i.e., solid triangles ▲, open triangles △, solid circles ● or open circles ○), and each set of signs that are connected together with a common line represents the chromaticity points of a single LED lamp. As shown in FIG. 3, each set of chromaticity points connected together shifts toward the upper right corner of the chromaticity diagram. This represents variations in the spectral distribution of illumination light due to a change in the amount of drive current supplied. In FIG. 3, each arrow indicates the direction in which the chromaticity point shifted due to an increase in the amount of drive current supplied to its associated LED lamp. As pointed by these arrows, as the amount of drive current supplied increases, the chromaticity changes toward the upper right corner of the chromaticity diagram.

To develop an LED lamp that can effectively eliminate such color shifting, the present inventors compared the spectral distribution resulting from a drive current of 5 mA with that resulting from a drive current of 40 mA for each of multiple types of LED lamps in the following manner.

First, illumination light was emitted from an LED lamp in which the light radiated from an LED chip had a narrow-band spectral distribution with a peak wavelength of 460 nm and that the light radiated from a phosphor had a broad-band spectral distribution with a peak wavelength of 575 nm.

Then, with drive currents of 5 mA and 40 mA respectively supplied, the spectral distributions of the illumination light were actually measured on a wavelength range of 380 nm to 780 nm (i.e., the visible radiation range) with the measuring wavelength changed at a step of 5 nm. The resultant spectral intensities were normalized with respect to a spectral intensity at the peak wavelength of 575 nm.

Thereafter, the magnitude of the spectral distribution resulting from the drive current of 5 mA was compared with that resulting from the drive current of 40 mA for each wavelength step. Specifically, the smaller spectral intensity was divided by the larger one and the quotient was multiplied by 100, thereby obtaining the percentage of invariance in spectral intensity, which will be referred to herein as an "inverse change rate". If the spectral distribution resulting from the drive current of 5 mA is the same as that resulting from the drive current of 40 mA at a certain wavelength (i.e., if the spectral intensities at that wavelength are equal to each other irrespective of the amount of drive current supplied), then the inverse change rate will be 100%. And if the inverse change rate is always 100 from 380 nm through 780 nm, then the spectral distribution resulting from the drive current of 5 mA is quite the same as that resulting from the drive current of 40 mA. In that case, the chromaticities calculated from the former spectral distribution will be equal to those calculated from the latter spectral distribution. Consequently, no color shifting should occur even if the amount of drive current supplied is increased from 5 mA to 40 mA. Stated otherwise, the close to zero the inverse change rate is, the more significant the difference in spectral distribution between the drive currents of 0.5 mA and 40 mA would be.

Figure 4:
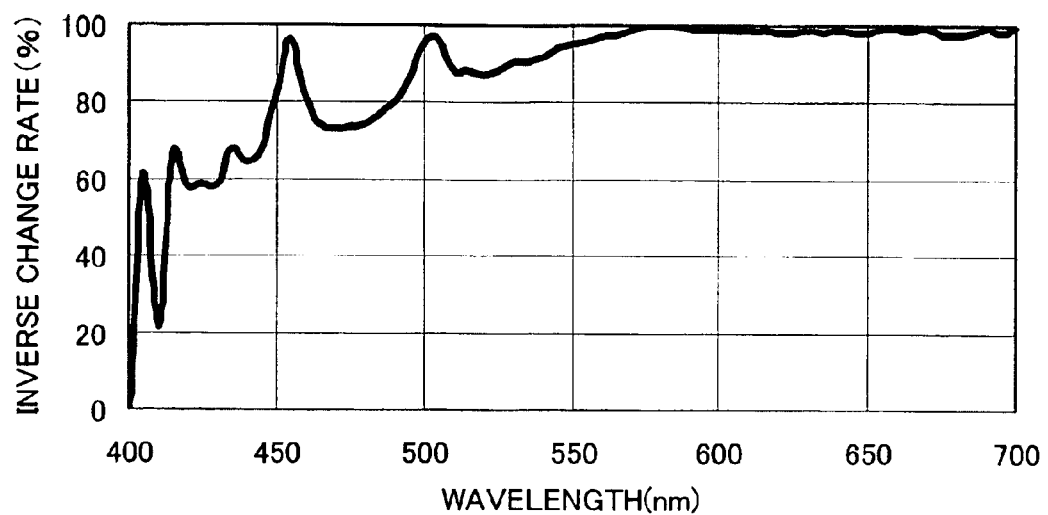
FIG. 4 is a graph showing a relationship between the wavelength and the inverse change rate in an LED lamp.

FIG. 4 is a graph showing the relationship between the wavelength of illumination light emitted from an LED lamp and the inverse change rate thereof. In FIG. 4, the abscissa represents the wavelength of the illumination light and the ordinate represents the inverse change rate. As can be seen from FIG. 4, the inverse change rates are generally low in the wavelength range of 400 nm to 545 nm. More specifically, in this wavelength range, the shorter the wavelength, the lower the inverse change rate tends to be, roughly speaking. However, the inverse change rate locally increases significantly in the vicinity of the wavelengths of 455 nm and 500 nm. In other words, the inverse change rates are relatively low in the wavelength range of 400 nm to 450 nm and at wavelengths of around 470 nm. Consequently, the intensity of light having a wavelength falling within these ranges with low inverse change rates easily decreases due to a change in the amount of drive current supplied.

The results of these researches and experiments revealed that the spectral distribution of illumination light easily changed in certain wavelength ranges, but hardly changed in others, even when the amount of drive current supplied was changed in the same way.

According to various preferred embodiments of the present invention, to minimize the unwanted color shifting that could be brought about by a change in the amount of drive current supplied, components of light, having wavelengths that fall within the range in which the inverse change rates are less than 100, are filtered out from the illumination light. More specifically, components of the illumination light of an LED lamp, falling within the wavelength range of 400 nm to 545 nm, are significantly reduced through a filtering member, thereby minimizing the color shifting that could be caused by a change in the amount of drive current supplied.

Hereinafter, various types of filtering members that can be used effectively in LED lamps according to preferred embodiments of the present invention will be described.

Filtering Member F1

Figure 5:
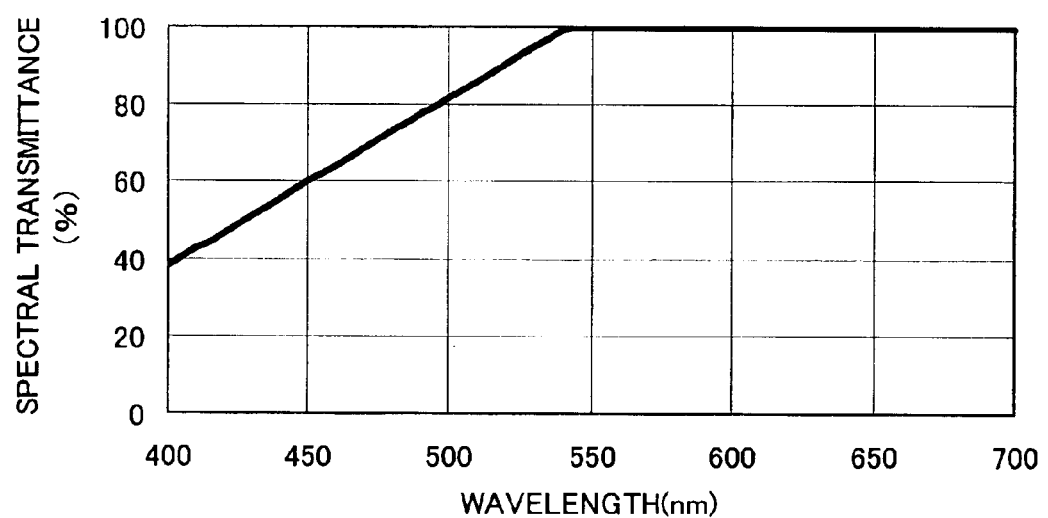
FIG. 5 is a graph showing the spectral transmittance of a filtering member F1 that may be used in an LED lamp according to a preferred embodiment of the present invention.

FIG. 5 is a graph showing the spectral transmittance of a filtering member F1 for use to control the spectral distribution of light emitted from an LED lamp. As shown in FIG. 5, this filtering member F1 has decreased spectral transmittances in the wavelength range of 400 nm to 545 nm. More specifically, the spectral transmittance of the filtering member F1 is 38% at a wavelength of 400 nm, but increases linearly as the wavelength increases from 400 nm toward 545 nm. And at the wavelength of 545 nm, the spectral transmittance of the filtering member F1 reaches 100%. After that, the spectral transmittance of the filtering member F1 remains 100% in the wavelength range of 545 nm to 700 nm.

Comparing the graphs shown in FIGS. 4 and 5 with each other, it can be seen that the spectral transmittance profile of the filtering member F1 roughly corresponds to the inverse change rate profile.

The present inventors actually evaluated the color shifting properties of an LED lamp having a configuration such as that shown in FIG. 10A and including the filtering member F1 (as a specific example of a preferred embodiment of the present invention) and an LED lamp including all components shown in FIG. 10A but the filtering member F1 (94) (as a comparative example).

The LED lamp shown in FIG. 10A includes a substrate 91, an LED chip 92 bonded to the substrate 91, a resin portion (wavelength converting portion) 93 including a phosphor, and the filtering member 94. The detailed configuration of this LED lamp will be described later. In this experiment, an LED bare chip with a length of 3 mm, a width of 3 mm and a thickness of 0.9 mm was used as the LED chip 92. The resin portion 93 was obtained by curing and molding a 70 to 30 mixture of phosphor and resin into a cylindrical shape with a height of 0.15 mm and a diameter of 1.4 mm, for example.

The difference between the chromaticity resulting from the drive current of 5 mA and that resulting from the drive current of 40 mA was calculated for each of the two types of LED lamps representing an example of a preferred embodiment of the present invention and a comparative example. More specifically, the degrees of color shifting occurring in the two LED lamps were evaluated by comparing the color temperatures and Duv (i.e., distance obtained by extending a vertical line from a chromaticity point to the Planckian locus on CIE 1960 x & y coordinates) thereof with each other.

Without the filtering member F1, the drive current of 5 mA resulted in a color temperature of 3,863 K and a Duv of 0.3, while the drive current of 40 mA resulted in a color temperature of 3,832 K and a Duv of 5.3. Thus, the difference in color temperature was 31 and the difference in Duv was 5.0. On the other hand, with the filtering member F1, the drive current of 5 mA resulted in a color temperature of 3,489 K and a Duv of 8.1, and the drive current of 40 mA also resulted in the same color temperature of 3,489 K and the same Duv of 8.1. That is to say, no difference was detected in color temperature or Duv.

Thus, it can be seen that the color shifting can be reduced significantly by providing the filtering member F1.

Similar evaluations were carried out on another pair of LED lamps, of which the resin portion 93 had been formed by curing and molding an 80 to 20 mixture of phosphor and resin into a cylindrical shape with a height of 1.2 mm and a diameter of 1.4 mm. In that case, the results were as follows.

Specifically, without the filtering member F1, the drive current of 5 mA resulted in a color temperature of 2,577 K and a Duv of 21.9, while the drive current of 40 mA resulted in a color temperature of 2,688 K and a Duv of 21.9. With the filtering member F1 on the other hand, the drive current of 5 mA resulted in a color temperature of 2,564 K and a Duv of 20.8, while the drive current of 40 mA resulted in a color temperature of 2,668 K and a Duv of 21.8.

Thus, by providing the filtering member F1, the color shifting can be minimized in various types of LED lamps.

Filtering Member F2

Next, another exemplary filtering member F2 will be described with reference to FIG. 6.

Figure 6:
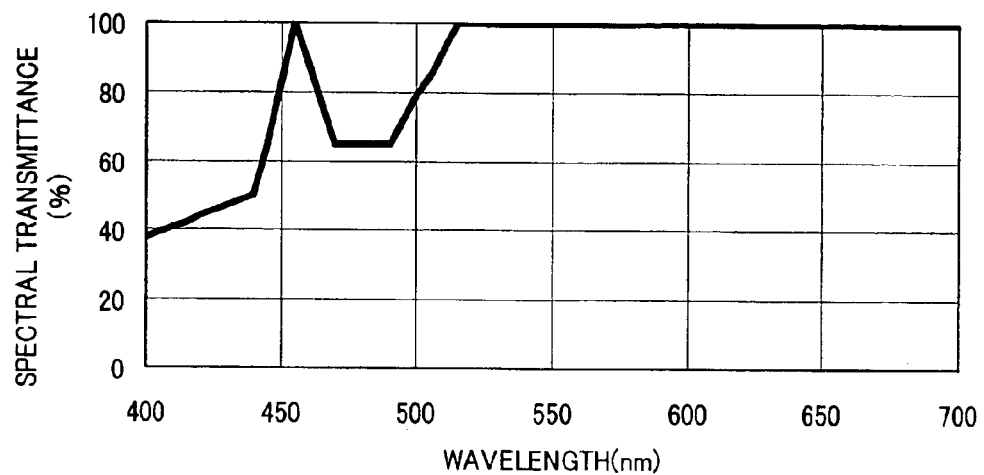
FIG. 6 is a graph showing the spectral transmittance of a filtering member F2 that may be used in an LED lamp according to another preferred embodiment of the present invention.

FIG. 6 is a graph showing the spectral transmittance of the filtering member F2. As shown in FIG. 6, the filtering member F2 has selectively decreased spectral transmittances in the wavelength range of 400 nm to 545 nm except around a wavelength of 455 nm. The LED chip for use in this example has an emission peak wavelength of about 460 nm. Thus, the filtering member F2 exhibits high spectral transmittances in a wavelength subrange surrounding the emission peak wavelength of the LED chip. More specifically, the spectral transmittance of the filtering member F2 was 38% at a wavelength of 400 nm but increased linearly in the wavelength range of 400 nm to 440 nm, at which the spectral transmittance reached 50%. Thereafter, the spectral transmittance increased linearly at a steeper rate in the wavelength range of 440 nm to 455 nm, at which the spectral transmittance reached 100%. Subsequently, the spectral transmittance decreased steeply in the wavelength range of 455 nm to 470 nm and then became constant at 65% in the wavelength range of 470 nm to 490 nm. After that, the spectral transmittance linearly increased again in the wavelength range of 490 nm to 515 nm, reached 100% at the wavelength of 515 nm, and then remained 100% in the wavelength range of 515 nm to 700 nm.

As shown in FIG. 4, the inverse change rate locally increased to almost 100 in the vicinity of a wavelength of 455 nm. That is to say, in the wavelength range of 400 nm to 545 nm, the variation in spectral distribution due to a change in the amount of drive current supplied was relatively small around the wavelength of 455 nm. Accordingly, the color shifting can be reduced significantly even if components of light having wavelengths of around 455 nm are not filtered out through the filtering member.

An LED lamp with the filtering member F2 representing a specific example of a preferred embodiment of the present invention and an LED lamp without the filtering member F2 representing a comparative example had their color temperatures and Duv measured in a similar manner. As a result, without the filtering member F2, the drive current of 5 mA resulted in a color temperature of 3,863 K and a Duv of 0.3, while the drive current of 40 mA resulted in a color temperature of 3,832 K and a Duv of 5.3. Thus, the difference in color temperature was 31 and the difference in Duv was 5.0.

With the filtering member F2 on the other hand, the drive current of 5 mA resulted in a color temperature of 3,600 K and a Duv of 4.7, while the drive current of 40 mA resulted in a color temperature of 3,618 K and a Duv of 9.6. Thus, the difference in color temperature was 18 and the difference in Duv was 4.8. Consequently, it can be seen that the color shifting can be reduced by providing the filtering member F2.

Filtering Member F3

Figure 7:
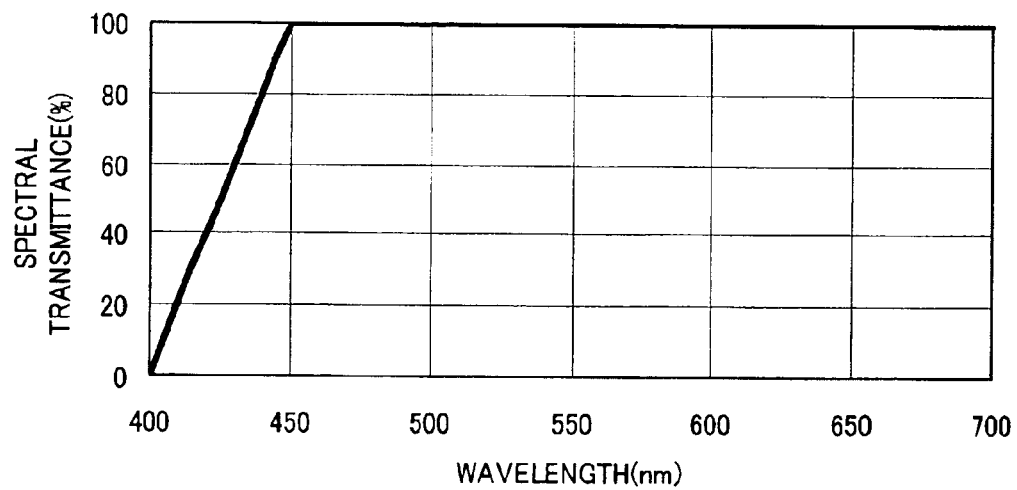
FIG. 7 is a graph showing the spectral transmittance of a filtering member F3 that may be used in an LED lamp according to still another preferred embodiment of the present invention.

Next, still another exemplary filtering member F3 will be described with reference to FIG. 7. FIG. 7 is a graph showing the spectral transmittance of the filtering member F3. As shown in FIG. 7, the filtering member F3 has selectively decreased spectral transmittances in the wavelength range of 400 nm to 450 nm. The LED chip for use in this example has an emission peak wavelength of about 460 nm. Thus, the filtering member F3 exhibits low spectral transmittances in a wavelength range that is shorter than the emission peak wavelength of the LED chip. More specifically, the spectral transmittance of the filtering member F3 was 0% at a wavelength of 400 nm but increased linearly in the wavelength range of 400 nm to 450 nm, at which the spectral transmittance reached 100%. Thereafter, the spectral transmittance remained 100% in the wavelength range of 450 nm to 700 nm.

As can be seen from FIG. 4, the inverse change rate in the wavelength subrange of 400 nm to 440 nm was the lowest in the overall wavelength range of 400 nm to 545 nm. Accordingly, even if only the spectral transmittances in that wavelength range of 400 nm to 440 nm are decreased by the filtering member F3, the color shifting that could be brought about due to a change in the amount of drive current supplied can also be minimized effectively.

An LED lamp with the filtering member F3 representing a specific example of a preferred embodiment of the present invention and an LED lamp without the filtering member F3 representing a comparative example had their color temperatures and Duv measured in a similar manner. As a result, without the filtering member F3, the drive current of 5 mA resulted in a color temperature of 2,577 K and a Duv of 21.9, while the drive current of 40 mA resulted in a color temperature of 2,688 K and a Duv of 21.9. Thus, the difference in color temperature was 111 and the difference in Duv was 0. With the filtering member F3 on the other hand, the drive current of 5 mA resulted in a color temperature of 2,582 K and a Duv of 20.9, while the drive current of 40 mA resulted in a color temperature of 2,687 K and a Duv of 21.9. Thus, the difference in color temperature was 105 and the difference in Duv was 1. Consequently, by providing the filtering member F3, Duv increased just by 1, the color temperature decreased by 6 K, and the color shifting could be reduced overall.

Filtering Member F4

Figure 8:
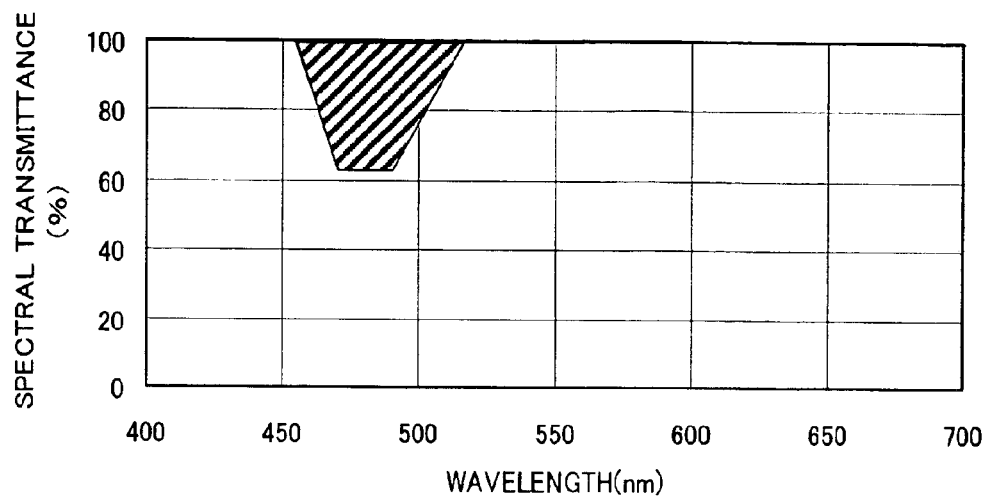
FIG. 8 is a graph showing the spectral transmittance of a filtering member F4 that may be used in an LED lamp according to yet another preferred embodiment of the present invention.

Next, yet another exemplary filtering member F4 will be described with reference to FIG. 8. FIG. 8 is a graph showing the spectral transmittance of the filtering member F4. As shown in FIG. 8, the filtering member F4 has selectively decreased spectral transmittances in the wavelength range of 455 nm to 515 nm. More specifically, the spectral transmittances of the filtering member F4 are obtained by increasing the spectral transmittances of the filtering member F2 in the wavelength range of 400 nm to 455 nm to 100%.

As used herein, the "filtering ratio" of a filtering member is the ratio of the hatched area (i.e., the absorption area within a range from a wavelength of 400 nm to a wavelength of 545 nm) to the overall area surrounded with the bold frame in FIG. 8.

An LED lamp with the filtering member F4 having a filtering ratio of 3%, representing a specific example of a preferred embodiment of the present invention, and an LED lamp without the filtering member F4, representing a comparative example, had their color temperatures and Duv measured in a similar manner. As a result, without the filtering member F4, the drive current of 5 mA resulted in a color temperature of 3,863 K and a Duv of 0.3, while the drive current of 40 mA resulted in a color temperature of 3,832 K and a Duv of 5.3. Thus, the difference in color temperature was 31 and the difference in Duv was 5.0. With the filtering member F4 on the other hand, the drive current of 5 mA resulted in a color temperature of 3,632 K and a Duv of 3.3, while the drive current of 40 mA resulted in a color temperature of 3,661 K and a Duv of 7.5. Thus, the difference in color temperature was 29 and the difference in Duv was 4.2. Consequently, by providing the filtering member F4, Duv decreased just by 0.8, the color temperature decreased only by 2 K, and the color shifting could be slightly reduced.

Accordingly, it can be seen that it is difficult to reduce the color shifting if the filtering member has a filtering ratio of less than 3% in the wavelength range of 400 nm to 545 nm.

Filtering Member F5

Figure 9:
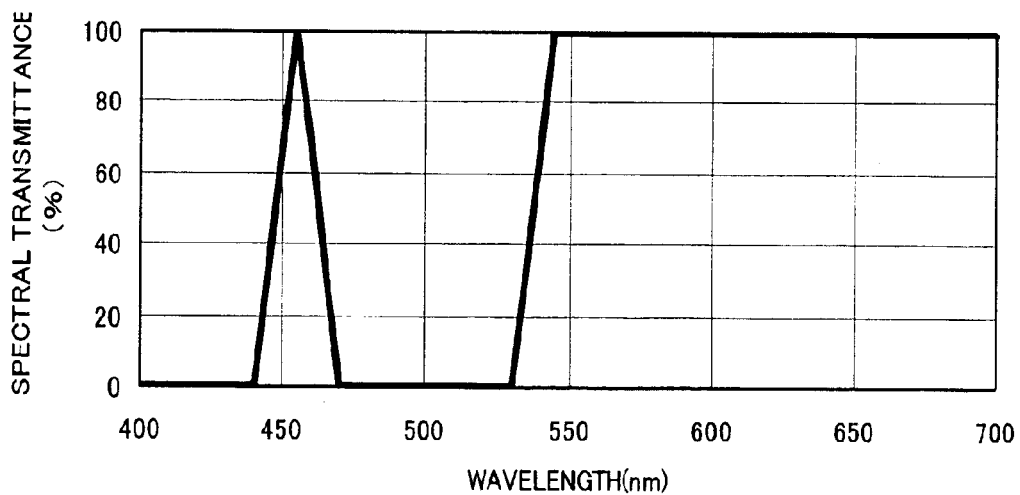
FIG. 9 is a graph showing the spectral transmittance of a filtering member F5 that may be used in an LED lamp according to yet another preferred embodiment of the present invention.

Next, yet another exemplary filtering member F5 will be described with reference to FIG. 9. FIG. 9 is a graph showing the spectral transmittances of the filtering member F5. The filtering member F5 has selectively decreased spectral transmittances in the wavelength range of 400 nm to 545 nm and has a filtering ratio of 35%. More specifically, the filtering member F5 had a spectral transmittance of 0% in the wavelength range of 400 nm to 440 nm and in the wavelength range of 470 nm to 530 nm. Also, the spectral transmittance of the filtering member F5 increased linearly in the wavelength range of 440 nm to 455 nm, at which the spectral transmittance reached 100%. Thereafter, the spectral transmittance decreased linearly in the wavelength range of 455 nm to 470 nm. After that, the spectral transmittance increased linearly again in the wavelength range of 530 nm to 545 nm, reached 100% at the wavelength of 545 nm, and then remained 100% in the wavelength range of 545 nm to 700 nm.

An LED lamp with the filtering member F5 having a filtering ratio of 35%, representing a specific example of a preferred embodiment of the present invention, and an LED lamp without the filtering member F5, representing a comparative example, had their color temperatures and Duv measured in a similar manner. As a result, without the filtering member F5, the drive current of 5 mA resulted in a color temperature of 2,577 K and a Duv of 21.9, while the drive current of 40 mA resulted in a color temperature of 2,688 K and a Duv of 21.9. Thus, the difference in color temperature was 111 and the difference in Duv was 0. With the filtering member F5 on the other hand, the drive current of 5 mA resulted in a color temperature of 2,310 K and a Duv of 15.9, while the drive current of 40 mA resulted in a color temperature of 2,387 K and a Duv of 16.6. Thus, the difference in color temperature was 77 and the difference in Duv was 0.7. Consequently, by providing the filtering member F5, Duv increased just by 0.7, the color temperature decreased by as much as 34 K, and the color shifting could be reduced significantly.

As can be seen from the description of these exemplary filtering members F1 through F5, by using a filtering member that is designed such that the spectral transmittance thereof becomes lower in at least a portion of the wavelength range of 400 nm to 545 nm than in the remaining visible radiation range, the color shifting that could occur due to a change in the amount of drive current supplied can be reduced significantly. Also, in a portion of the wavelength range of 400 nm to 545 nm, including the emission peak wavelength of an LED chip, the spectral transmittance is preferably relatively high.

Hereinafter, LED lamps according to preferred embodiments of the present invention will be described with reference to the accompanying drawings. In the drawings, a number of different members, appearing on multiple sheets but having substantially the same functions, are collectively identified by the same reference numeral for the sake of simplicity.

Embodiment 1

First, an LED lamp according to a first specific preferred embodiment of the present invention will be described with reference to FIG. 10A.

As shown in FIG. 10A, the LED lamp preferably includes a substrate 91, an LED chip 92 bonded to the substrate 91, a resin portion 93 including a phosphor (or luminophore), and a filtering member 94.

In this preferred embodiment, the LED chip 92 is preferably flip-chip bonded to the principal surface of the substrate 91. Although not shown in FIG. 9A, interconnects are actually provided on the substrate 91 and electrically connected to the electrodes of the LED chip 92 mounted. The LED chip 92 is preferably supplied with a predetermined current or voltage from a lighting circuit (not shown) and through the interconnects on the substrate 91 to make the LED chip 92 emit the light.

The phosphor dispersed in the resin portion 93 absorbs, and is excited by, the emission of the LED chip 92, thereby producing fluorescence. The light produced from the phosphor preferably has a longer wavelength than the emission of the LED chip 92. For example, when a blue LED chip is used as the LED chip 92, $(Y.Sm)_3$, $(Al.Ga)_5O_{12}$:Ce or $(Y_{0.39}Gd_{0.57}Ce_{0.03}Sm_{0.01})_3Al_5O_{12}$ can be used effectively as the phosphor. By using such a phosphor, part of the blue ray emitted from the LED chip 92 can be transformed into a yellow ray and the resultant illumination light looks almost white overall.

In this preferred embodiment, the resin portion 93 preferably has a side surface, which is separated from another surface (not shown) that can reflect the outgoing light of the resin portion 93. More specifically, the resin portion 93 is preferably formed in a cylindrical shape so as to have a diameter longer than the diagonals of the LED chip 92 and be higher than the LED chip 92. The side surface of the resin portion 93 is preferably a curved surface that surrounds the side surfaces of the LED chip 92. As used herein, the "surface that can reflect the outgoing light of the resin portion 93" is typically a reflective surface of a reflective member that is provided specially for the purpose of reflection but may also be a surface of any other member.

Figure 11:
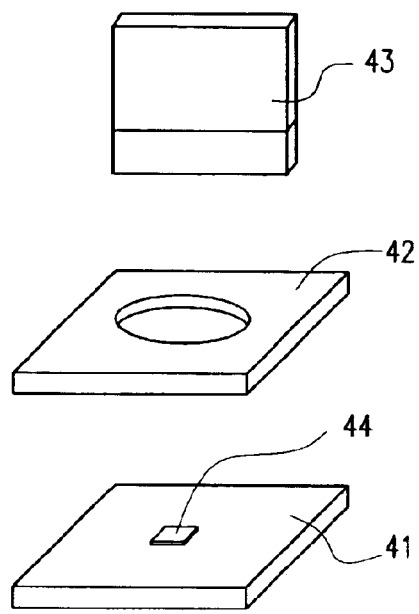
FIG. 11 is a perspective view showing an exemplary method of forming the cylindrical resin portion (wavelength converting portion) shown in FIG. 10.

The resin portion 93 may be formed as shown in FIG. 11, for example. More specifically, first, a substrate 41 on which an LED chip 44 has been mounted is preferably prepared. In this preferred embodiment, the LED chip 44 is preferably flip-chip bonded to the principal surface of the substrate 41. Next, a plate 42 with a cylindrical hole (opening) is brought into close contact with the principal surface of the substrate 41. Thereafter, a resin liquid including the phosphor is poured into the cylindrical hole. The plate 42 preferably has a thickness of about 0.02 mm to about 1.1 mm. The diameter of the hole is preferably longer (e.g., 0.8 mm) than the diagonals (of 0.3 mm to 1.0 mm, for example) of the LED chip 44.

After the resin liquid has been poured into the hole of the plate 42, the excessive part of the resin liquid over the upper surface of the plate 42 is flattened with a squeeze 43 and then the resin liquid is thermally set. Thereafter, the plate 42 is removed from over the substrate 41, thereby obtaining a cylindrical resin portion that covers the LED chip 44 entirely.

The filtering member 94 of this preferred embodiment is provided outside of the resin portion 93 and covers the resin portion 93 so as to receive the outgoing light of the resin portion 93. The filtering member 94 is preferably designed such that the spectral transmittance thereof becomes lower in at least a portion of the wavelength range of 400 nm to 545 nm than in the remaining visible radiation range (e.g., at a wavelength of 550 nm).

In this preferred embodiment, the filtering member 94 may be made of any material as long as the filtering member 94 can exhibit such a filtering characteristic. For example, the filtering member 94 may be made of a resin because a resin is a relatively inexpensive material. Among other things, a silicone resin is particularly preferred considering its rich flexibility and sufficiently high resistance to thermal stress. It should be noted that such a resin may be provided with the filtering characteristic by mixing an additive such as neodymium with the material (e.g., a resin) of the filtering member. Alternatively, a transparent member covered with either a multilayer interference film or a chemical coating may be used as the filtering member of this preferred embodiment.

The emission of the LED chip 92 excites the phosphor in the resin portion 93, thereby making the phosphor produce fluorescence. In FIGS. 10A through 10D, the emission of the LED chip 92 and the fluorescence produced by the phosphor are schematically indicated by the arrows with the reference numeral 95. Also, the emission and fluorescence will be collectively referred to herein as "light rays" 95.

Figure 2:
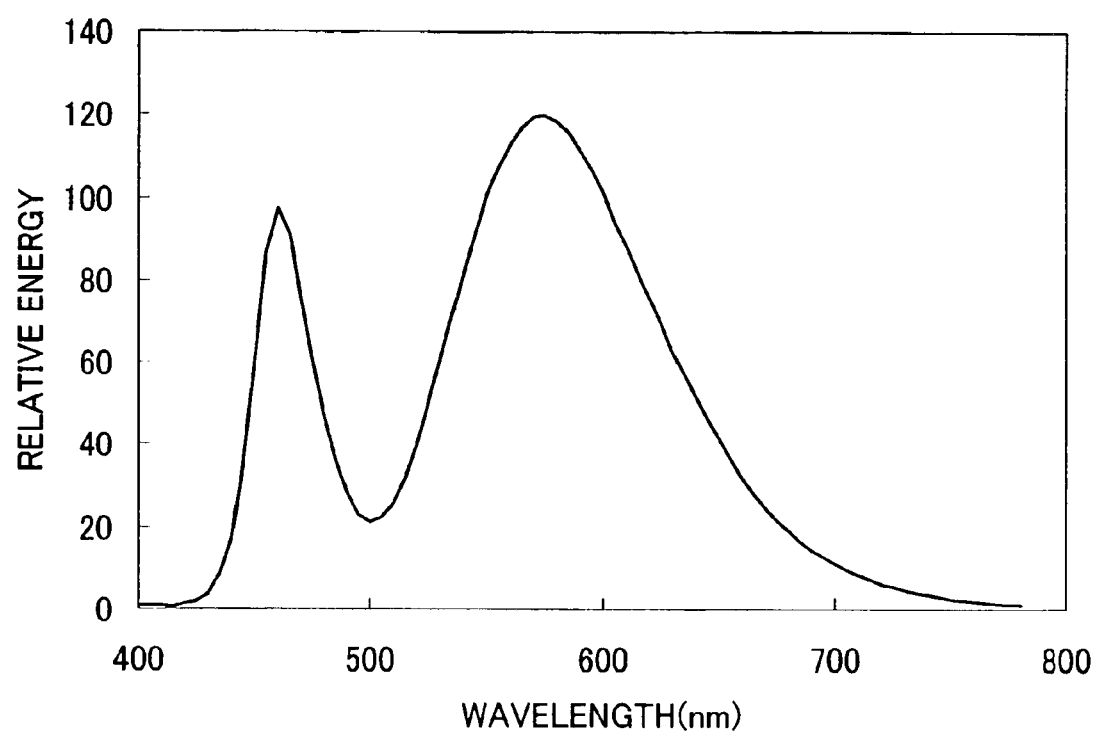
FIG. 2 is a graph showing the spectrum of the emission of an LED chip.

The light rays 95 may have a spectral distribution such as that shown in FIG. 2, for example. However, while being transmitted through the filtering member 94, the light rays may be transformed into light rays with a spectral distribution that does not cause color shifting easily.

Each of FIGS. 10A through 10D illustrates the single LED chip 92 that has been bonded to the substrate 91. Alternatively, multiple LED chips 92 may also be bonded onto the substrate 91. In that case, each of those LED chips 92 may be covered with the filtering member 94 separately or all of those LED chips 92 may be covered with the same filtering member 94. This statement will apply to any of the preferred embodiments of the present invention to be described below.

Embodiment 2

Hereinafter, an LED lamp according to a second specific preferred embodiment of the present invention will be described with reference to FIG. 10B. The LED lamp of this second preferred embodiment has almost the same configuration as the counterpart of the first preferred embodiment described above. In this preferred embodiment, however, the resin portion 93 and the filtering member 94 are arranged differently from the first preferred embodiment. Specifically, in the first preferred embodiment described above, a gap is provided between the resin portion 93 and the filtering member 94 as shown in FIG. 10A. In this second preferred embodiment on the other hand, the resin portion 93 and the filtering member 94 are in close contact with each other as shown in FIG. 10B. The reason is as follows. If the boundary 96 between the resin portion 93 and the filtering member 94 defines an interface between dissimilar materials, then the light will be refracted at the interface, thus decreasing the optical extraction efficiency. Thus, to maintain sufficiently high extraction efficiency, the filtering member 94 and the resin portion 93 are preferably made of the same resin material. Also, if in the manufacturing process step of forming the resin portion 93, the filtering member 94 is made of the same resin on the resin portion 93 that has not yet been quite cured, then the bond strength between the resin portion 93 and the filtering member 94 can be increased effectively. In that case, substantially no interface will be present between the resin portion 93 and the filtering member 94.

Embodiment 3

Hereinafter, an LED lamp according to a third specific preferred embodiment of the present invention will be described with reference to FIG. 10C. Unlike the LED lamp of the second preferred embodiment described above, the LED lamp of this preferred embodiment further includes a reflector 97 on the substrate 91.

The reflector 97 has at least one reflective surface for reflecting the light that has gone out of the LED chip 92 through the side surfaces thereof away from the substrate 91 (preferably perpendicularly to the principal surface of the substrate 91). This reflective surface is preferably provided so as to surround the side surfaces of the LED chip 92. If multiple LED chips 92 have been bonded to the substrate 91, then the reflector 97 preferably has multiple openings (through holes) for the respective LED chips 92. In that case, the inner walls of each opening of the reflector 97 function as the reflective surfaces. The inner walls (i.e., reflective surfaces) of each opening of the reflector 97 are preferably downwardly tapered toward the principal surface of the substrate. The cross-sectional shape of the reflective surfaces as taken on a plane that crosses the principal surface of the substrate at right angles does not have to be linear but may be curved.

The filtering member 94 of this preferred embodiment is preferably located inside of the opening of the reflector 97 and functions as a lens. As in the preferred embodiments described above, the filtering member 94 of this preferred embodiment is also preferably made of a resin.

Embodiment 4

Hereinafter, an LED lamp according to a fourth specific preferred embodiment of the present invention will be described with reference to FIG. 10D. Unlike the LED lamp of the third preferred embodiment described above, the resin portion (i.e., first resin portion) 93 of the LED lamp of this preferred embodiment is covered with a second resin portion 98 and a filtering member 96 is provided on the reflector 97. As described above, if an interface is present at the boundary between the first and second resin portions 93 and 98, then the optical extraction efficiency will decrease. For that reason, no definite interface is preferably defined at the boundary.

In the preferred embodiment shown in FIG. 10D, the filtering member 96 has a flat plate shape. Alternatively, the filtering member 96 may also have a convex surface functioning as a lens.

In the first through fourth preferred embodiments of the present invention described above, the filtering member is provided separately from the resin portion 93 including the phosphor. However, if the resin portion 93 further includes an additive such as Nd, then at least part of the resin portion 93 may function as the filtering member.

Embodiment 5

Figure 12:
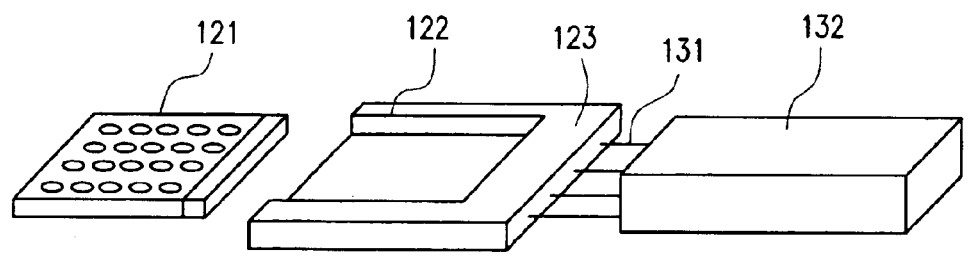
FIG. 12 is a perspective view schematically illustrating an LED lamp according to a fifth specific preferred embodiment of the present invention.

Hereinafter, an LED lamp according to a fifth specific preferred embodiment of the present invention will be described with reference to FIG. 12. FIG. 12 is a perspective view illustrating a card LED lamp 121 according to this preferred embodiment, a connector 123 to/from which the LED lamp 121 is attachable and removable, and a lighting circuit 132 to be electrically connected to the LED lamp 121 by way of the connector 123.

As shown in FIG. 12, the card LED lamp 121 is preferably inserted into the connector 123 through a pair of guide grooves 122. The guide grooves 122 are provided to slide the edges of the substrate of the LED lamp 121 in a predetermined direction while the LED lamp 121 is being inserted into, or removed from, the connector 123. The connector 123 includes a feeder electrode (not shown) to be electrically connected to the feeder electrode (not shown) of the card LED lamp 121, and is connected to the lighting circuit 132 via lines 131.

The LED lamp 121 includes a plurality of LED chips, which are preferably bonded to a rectangular substrate. Each of those LED chips is preferably covered with the cylindrical resin portion, which is preferably further covered with a filtering member. This filtering member is designed such that the spectral transmittance thereof becomes lower in at least a portion of the wavelength range of 400 nm to 545 nm than in the remaining visible radiation range.

Optionally, the substrate of the LED lamp 121 may have a multilevel interconnect structure for connecting the respective LED chips to the feeder electrode. Also, a metallic reflector with multiple openings for the respective LED chips may be attached to the surface of the substrate.

In this manner, the LED lamp 121 of this preferred embodiment has a card shape, which is similar to a memory card, for example, and can be attached to, or removed from, any of various types of appliances with a connector. Accordingly, even when the LED lamp 121 that has been used in an illumination unit runs out of its life, the illumination unit can be used continuously by replacing the exhausted LED lamp 121 with a brand-new LED lamp of the same shape. Also, if multiple types of LED lamps 121 with mutually different properties are appropriately selected and fitted in an illumination unit one after another, the same illumination unit can provide various types of illumination lights.

Figure 13:
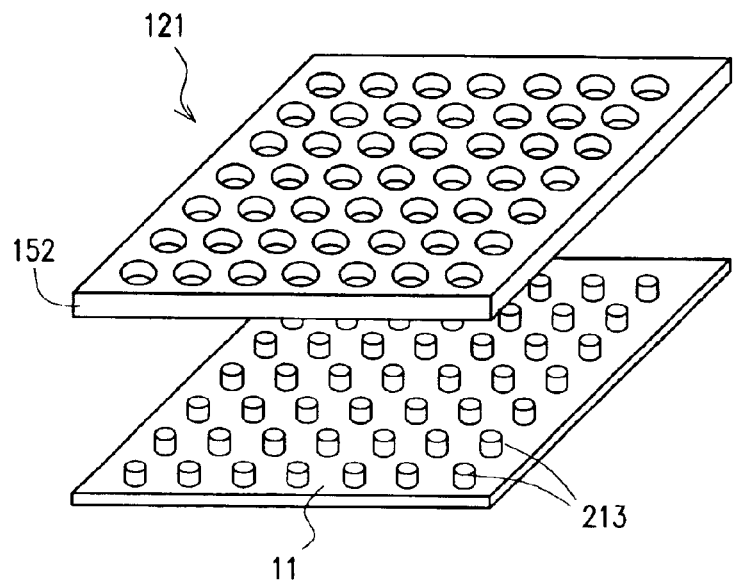
FIG. 13 is an exploded perspective view of a card LED lamp according to a preferred embodiment of the present invention.
Figure 14:
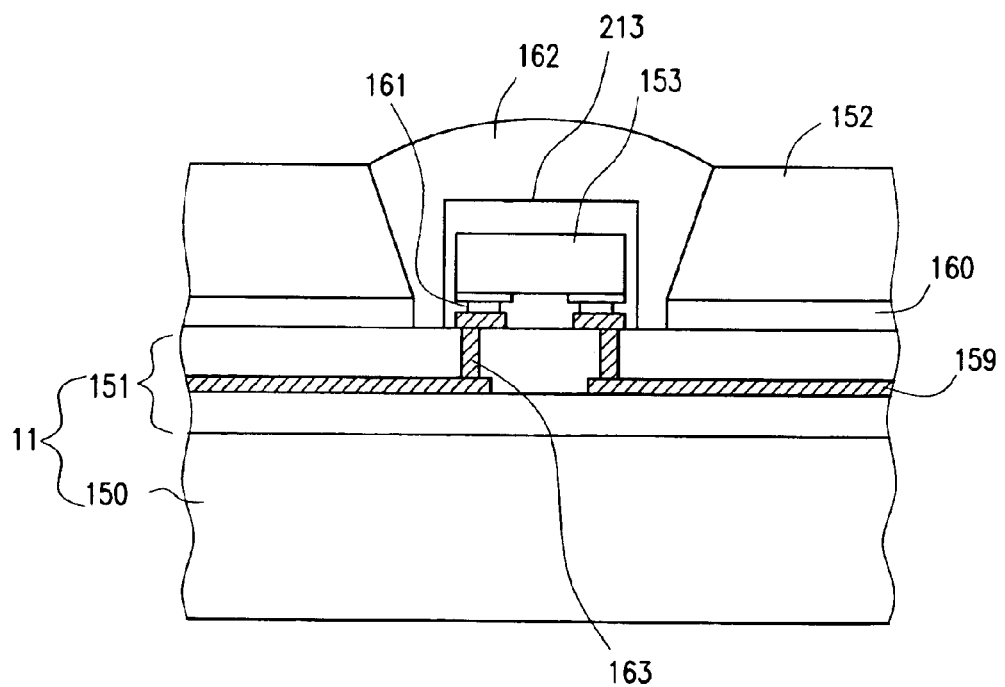
FIG. 14 is a cross-sectional view illustrating a portion of the card LED lamp shown in FIG. 13 including an LED chip.

Next, the configuration of the card LED lamp 121 of this preferred embodiment will be described in further detail with reference to FIGS. 13 and 14. FIG. 13 is an exploded perspective view of the card LED lamp 121. FIG. 14 is a cross-sectional view illustrating a portion of the card LED lamp 121 including an LED chip.

Referring to FIG. 13, the LED lamp 121 of this preferred embodiment preferably includes a plurality of cylindrical resin portions 213, which are arranged in matrix on a substrate 11. Although not shown in FIG. 13, each of the resin portions 213 includes an LED chip that has been molded with the resin. As described above, a phosphor is preferably dispersed in the cylindrical resin portion 213 to transform the emission of the LED chip into light with a longer wavelength.

A reflector 152 with multiple openings surrounding the respective cylindrical resin portions 213 is preferably attached to the surface (i.e., the mount-side surface) of the substrate 11. The inside surface of each opening of the reflector 152 functions as a reflective surface for reflecting the emission of the cylindrical resin portion 213.

Next, referring to FIG. 14, each LED chip 153 of this preferred embodiment is preferably flip-chip bonded to an interconnect pattern 159 of a multilayer wiring board 151, which is attached to a metal plate 150. In this case, the metal plate 150 and the multilayer wiring board 151 together make up the substrate 11. The LED chip 153 is covered with the resin portion 213 including the phosphor. And this resin portion 213 is further covered with a second resin portion 162 functioning as a lens. This second resin portion 162 preferably includes about 0.01% to about 30% (more preferably at least about 0.1%) of neodymium as an additive and may function as a filtering member just like the counterpart 94 shown in FIG. 10C.

In this preferred embodiment, the multilayer wiring board 151 includes a two-layered interconnect pattern 159, in which interconnects belonging to the two different layers are connected together by way of via metals 163. Specifically, the interconnects belonging to the upper layer are connected to the electrodes of the LED chip 153 via Au bumps 161. The interconnect pattern 159 may be made of copper, nickel, aluminum, or an alloy mainly composed of these metals, for example.

The upper surface of the multilayer wiring board 151 having such a configuration is mostly covered with the reflector 152 but is partially exposed. A number of feeder electrodes (not shown) are provided on the exposed areas of the multilayer wiring board 151. These feeder electrodes are electrically connected to the lighting circuit of an illumination unit by way of the connector into which the card LED lamp is inserted.

In the example illustrated in FIG. 14, an underfill (stress relaxing) layer 160 is preferably provided between the reflector 152 and the multilayer wiring board 151. This underfill layer 160 can not only relax the stress, resulting from the difference in thermal expansion coefficient between the metallic reflector 152 and the multilayer wiring board 151, but also ensure electrical insulation between the reflector 152 and the upper-level interconnects of the multilayer wiring board 151.

According to this preferred embodiment, the freely attachable and removable card LED lamp can provide illumination light with a high color rendering property.

Figure 1:
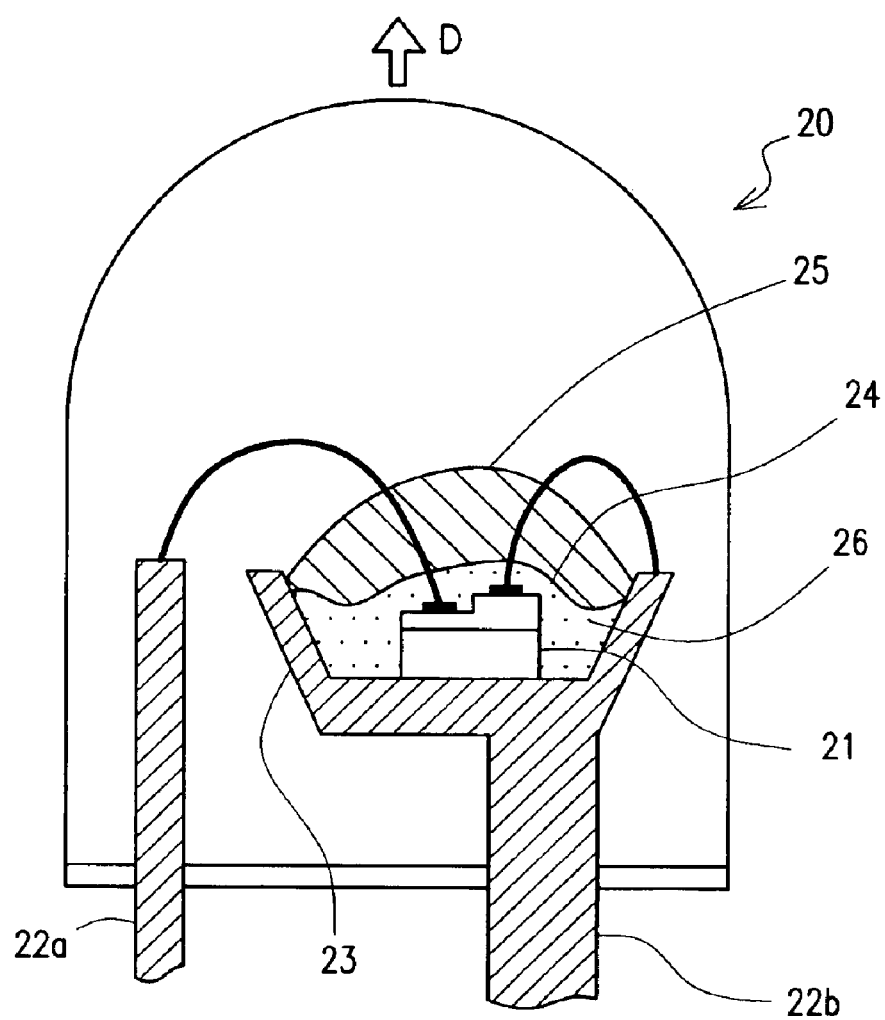
FIG. 1 is a cross-sectional view illustrating a conventional LED lamp.

In the preferred embodiments described above, the filtering member is fixed onto the substrate on which the LED chip has been bonded. However, the present invention is in no way limited to such specific preferred embodiments. For example, the filtering member may also be provided for the connector 123 shown in FIG. 12. The point is the present invention only requires that the filtering member be provided at such a position as to filter the illumination light that has gone out of the LED chip and wavelength converting portion of the LED lamp. Optionally, the present invention is also applicable for use even in an LED lamp having the bullet package shown in FIG. 1. In that case, at least part of the second resin portion 25 or glass housing may function as the filtering member.

Optionally, at least part of the wavelength converting portion may function as the filtering means by adding a material, which absorbs light in a particular wavelength range, to the resin functioning as the wavelength converting portion.

An LED lamp according to any of various preferred embodiments of the present invention described above is effectively applicable for use as any of various types of illumination sources to replace the conventional white incandescent lamps.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. An LED lamp comprising
at least one LED chip having an emission peak wavelength of 400 nm to 490 nm, and
a wavelength converting portion including a phosphor for transforming the emission of the LED chip into light having a longer wavelength than that of the emission, wherein the LED lamp further includes filtering means, of which the spectral transmittance is adjusted so as to minimize color shifting even if the amount of current supplied to the LED chip to make the LED chip produce the emission has changed and wherein the spectral transmittance of the filtering means corresponds to a wavelength dependence of an inverse change rate.

2. The LED lamp of claim 1, wherein the spectral transmittance of the filtering means is relatively low in a wavelength subrange in which the inverse change rate is less than 100%.

3. The LED lamp of claim 1, wherein the filtering means is designed such that the spectral transmittance thereof becomes lower in at least a portion of the wavelength range of 400 nm to 545 nm than in the remaining visible radiation range.

4. The LED lamp of claim 3, wherein the filtering means is designed such that the spectral transmittance thereof becomes lower in at least a portion of a wavelength range, which is shorter than the emission peak wavelength of the LED chip, than in the remaining visible radiation range.

5. The LED lamp of claim 1, wherein in the wavelength range of 400 nm to 545 nm, the filtering means has a filtering ratio of 3% to 35%.

6. The LED lamp of claim 1, wherein the LED chip is mounted on a substrate.

7. The LED lamp of claim 6, wherein the LED chip is flip-chip bonded to the substrate.

8. The LED lamp of claim 1, wherein the wavelength converting portion is made of a resin.

9. The LED lamp of claim 8, wherein the wavelength converting portion has a cylindrical shape and covers the LED chip entirely.

10. The LED lamp of claim 8, wherein the wavelength converting portion is covered with another resin.

11. The LED lamp of claim 1, wherein the filtering means is arranged so as to cover the wavelength converting portion.

12. The LED lamp of claim 1, wherein the filtering means is made of a resin.

13. The LED lamp of claim 1, wherein the wavelength converting portion and the filtering means are both made of the same resin and substantially no interface is present between the wavelength converting portion and the filtering means.

14. The LED lamp of claim 1, wherein the LED lamp has a card shape so as to be attachable to, or removable from, an illumination unit including a lighting circuit.

* * * * *